(12) United States Patent
Kubo

(10) Patent No.: US 9,000,410 B2
(45) Date of Patent: Apr. 7, 2015

(54) NONVOLATILE MEMORY DEVICE

(71) Applicant: Koichi Kubo, Kanagawa-ken (JP)

(72) Inventor: Koichi Kubo, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 315 days.

(21) Appl. No.: 13/678,051

(22) Filed: Nov. 15, 2012

(65) Prior Publication Data

US 2013/0128651 A1     May 23, 2013

(30) Foreign Application Priority Data

Nov. 21, 2011    (JP) .................... 2011-254283

(51) Int. Cl.
*H01L 45/00*     (2006.01)
*G11C 11/00*     (2006.01)
*G11C 13/00*     (2006.01)
*H01L 27/24*     (2006.01)

(52) U.S. Cl.
CPC ............... *H01L 45/00* (2013.01); *G11C 11/00* (2013.01); *G11C 13/00* (2013.01); *H01L 45/085* (2013.01); *H01L 45/1233* (2013.01); *H01L 45/1253* (2013.01); *H01L 45/145* (2013.01); *H01L 45/148* (2013.01); *H01L 27/2409* (2013.01); *H01L 27/2481* (2013.01)

(58) Field of Classification Search
CPC ............................. H01L 45/08; H01L 45/085
USPC ................... 257/2–5, E45.001–E45.003
See application file for complete search history.

(56) References Cited

U.S. PATENT DOCUMENTS

| | | | |
|---|---|---|---|
| 7,400,522 B2 * | 7/2008 | Toda et al. | 365/148 |
| 7,663,132 B2 * | 2/2010 | Toda et al. | 257/3 |
| 7,733,684 B2 | 6/2010 | Kubo et al. | |
| 7,749,805 B2 * | 7/2010 | Pinnow et al. | 438/102 |
| 8,760,908 B2 * | 6/2014 | Kunitake et al. | 365/148 |
| 8,816,318 B2 * | 8/2014 | Kubo | 257/4 |
| 2007/0205416 A1 * | 9/2007 | Sakata et al. | 257/79 |
| 2008/0239932 A1 * | 10/2008 | Kamata et al. | 369/126 |
| 2009/0137112 A1 * | 5/2009 | Tabata et al. | 438/631 |
| 2010/0211725 A1 * | 8/2010 | Nagashima et al. | 711/103 |

FOREIGN PATENT DOCUMENTS

JP     2008-84512 A     4/2008

* cited by examiner

*Primary Examiner* — Allison P Bernstein
(74) *Attorney, Agent, or Firm* — Oblon, McClelland, Maier & Neustadt, L.L.P.

(57) ABSTRACT

According to one embodiment, a nonvolatile memory device includes a first conductive unit, a second conductive unit, and a memory layer. The memory layer is provided between the first conductive unit and the second conductive unit. The memory layer is capable of reversibly transitioning between a first state with a low resistance and a second state with a higher resistance than the first state due to a current supplied via the first conductive unit and the second conductive unit. The memory layer has a chalcopyrite structure.

20 Claims, 14 Drawing Sheets

| x | y | z | Ev |
|---|---|---|---|
| 0.29 | 0.89 | 1.8 | × |
| 0.29 | 0.91 | 1.7 | × |
| 0.29 | 0.91 | 1.8 | × |
| 0.29 | 0.91 | 1.9 | × |
| 0.29 | 0.91 | 2 | × |
| 0.29 | 1.09 | 2 | × |
| 0.29 | 1.09 | 2.1 | × |
| 0.29 | 1.09 | 2.2 | × |
| 0.29 | 1.09 | 2.3 | × |
| 0.29 | 1.11 | 2.1 | × |
| 0.31 | 0.89 | 1.8 | × |
| 0.31 | 0.91 | 1.7 | × |
| 0.31 | 0.91 | 1.8 | ○ |
| 0.31 | 0.91 | 1.9 | ○ |
| 0.31 | 0.91 | 2 | × |
| 0.31 | 1.09 | 2 | × |
| 0.31 | 1.09 | 2.1 | ○ |
| 0.31 | 1.09 | 2.2 | ○ |
| 0.31 | 1.09 | 2.3 | × |
| 0.31 | 1.11 | 2.1 | × |
| 0.99 | 0.89 | 1.8 | × |
| 0.99 | 0.91 | 1.7 | × |
| 0.99 | 0.91 | 1.8 | ○ |
| 0.99 | 0.91 | 1.9 | ○ |
| 0.99 | 0.91 | 2 | × |
| 0.99 | 1.09 | 2 | × |
| 0.99 | 1.09 | 2.1 | ○ |
| 0.99 | 1.09 | 2.2 | ○ |
| 0.99 | 1.09 | 2.3 | × |
| 0.99 | 1.11 | 2.1 | × |
| 1.01 | 0.89 | 1.8 | × |
| 1.01 | 0.91 | 1.7 | × |
| 1.01 | 0.91 | 1.8 | × |
| 1.01 | 0.91 | 1.9 | × |
| 1.01 | 0.91 | 2 | × |
| 1.01 | 1.09 | 2 | × |
| 1.01 | 1.09 | 2.1 | × |
| 1.01 | 1.09 | 2.2 | × |
| 1.01 | 1.09 | 2.3 | × |
| 1.01 | 1.11 | 2.1 | × |

FIG. 4

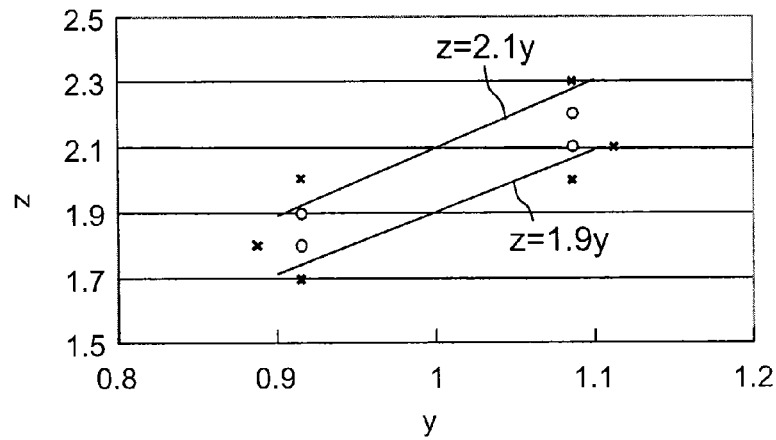

FIG. 5

| | Memory Layer | Electrode Layer | σ (V) |
|---|---|---|---|
| SP27 | $CoSiN_2$ | $AlN_{0.09}C_{0.01}$ | <0.05 |
| SP28 | $CoSiN_2$ | $Al_{0.09}Ge_{0.01}N$ | <0.05 |
| SP29 | $FeSiN_2$ | $AlN_{0.09}C_{0.01}$ | <0.05 |
| SP30 | $Fe_{0.7}SiN_2$ | $AlN_{0.09}C_{0.01}$ | <0.05 |
| SP31 | $MnGeN_2$ | $AlN_{0.09}C_{0.01}$ | <0.05 |
| SP32 | $FeGeN_2$ | $AlN_{0.09}C_{0.01}$ | <0.05 |
| SP33 | $CoGeN_2$ | $AlN_{0.09}C_{0.01}$ | <0.05 |
| SP34 | $Fe_{0.7}GeN_2$ | $AlN_{0.09}C_{0.01}$ | <0.05 |
| SP35 | $FeSiN_2$ | $Al_{0.09}Ge_{0.01}N$ | <0.05 |
| SP36 | $Fe_{0.7}SiN_2$ | $Al_{0.09}Ge_{0.01}N$ | <0.05 |
| SP37 | $MnGeiN_2$ | $Al_{0.09}Ge_{0.01}N$ | <0.05 |
| SP38 | $FeGeN_2$ | $Al_{0.09}Ge_{0.01}N$ | <0.05 |
| SP39 | $CoGeN_2$ | $Al_{0.09}Ge_{0.01}N$ | <0.05 |
| SP40 | $Fe_{0.7}GeN_2$ | $Al_{0.09}Ge_{0.01}N$ | <0.05 |
| SP41 | $CoSiP_2$ | $Al_{0.09}Ge_{0.01}N$ | <0.05 |
| SP42 | $MnSiP_2$ | $Al_{0.09}Ge_{0.01}N$ | <0.05 |
| SP43 | $CoSiN_2$ | $Al_{0.07}Ga_{0.02}Ge_{0.01}N$ | <0.05 |
| SP44 | $CoSiN_2$ | $Al_{0.07}Ga_{0.02}N_{0.09}C_{0.01}$ | <0.05 |
| SP45 | $CoSiN_2$ | TiN | 0.25 |
| SP46 | $FeSiN_2$ | TiN | 0.31 |
| SP47 | $Fe_{0.7}SiN_2$ | TiN | 0.29 |
| SP48 | $MnGeN_2$ | TiN | 0.37 |
| SP49 | $FeGeN_2$ | TiN | 0.26 |
| SP50 | $CoGeN_2$ | TiN | 0.34 |

FIG. 6

NONVOLATILE MEMORY DEVICE

CROSS-REFERENCE TO RELATED APPLICATIONS

This application is based upon and claims the benefit of priority from the prior Japanese Patent Application No. 2011-254283, filed on Nov. 21, 2011; the entire contents of which are incorporated herein by reference.

FIELD

Embodiments described herein relate generally to a nonvolatile memory device.

BACKGROUND

These days, small-sized mobile devices are widely used all over the world, and at the same time demand for small-sized large capacity nonvolatile memory devices is rapidly expanding with the significant development of high-speed information transmission networks. Some new memories aimed at greatly exceeding the limit of the memory density are proposed. For example, a memory using a resistance change material having a low resistance state and a high resistance state is proposed. Exhibiting high performance stably is desired for the resistance change nonvolatile device.

BRIEF DESCRIPTION OF THE DRAWINGS

FIG. 4 is a table illustrating characteristics of the nonvolatile memory device;

FIG. 5 is a graph illustrating characteristics of the nonvolatile memory device;

FIG. 6 is a table illustrating characteristics of the nonvolatile memory device;

DETAILED DESCRIPTION

Figure 1:
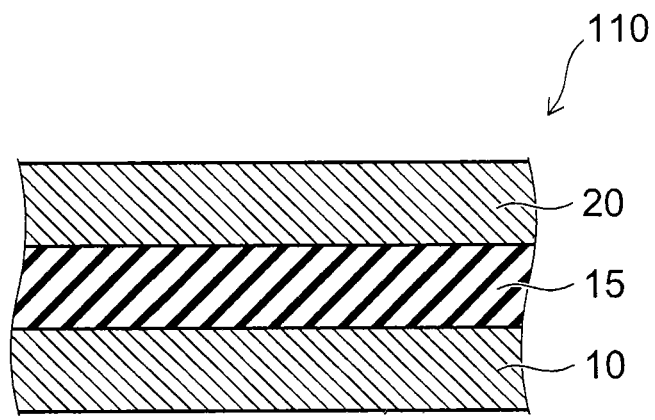
FIG. 1 is a schematic cross-sectional view illustrating the configuration of a nonvolatile memory device according to a first embodiment.

According to one embodiment, a nonvolatile memory device includes a first conductive unit, a second conductive unit, and a memory layer. The memory layer is provided between the first conductive unit and the second conductive unit. The memory layer is capable of reversibly transitioning between a first state with a low resistance and a second state with a higher resistance than the first state due to a current supplied via the first conductive unit and the second conductive unit. The memory layer has a chalcopyrite structure.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a schematic cross-sectional view illustrating the configuration of a nonvolatile memory device according to a first embodiment.

As shown in FIG. 1, a nonvolatile memory device 110 according to the embodiment includes a first conductive unit 10, a second conductive unit 20, and a memory layer 15. The memory layer 15 is provided between the first conductive unit 10 and the second conductive unit 20.

A current is supplied to the memory layer 15 via the first conductive unit 10 and the second conductive unit 20. The memory layer 15 can reversibly transition between a first state with a low resistance (a low resistance state) and a second state with a higher resistance than the first state (a high resistance state) due to the current. The memory layer 15 has the chalcopyrite structure.

The memory layer 15 includes, for example, a material expressed by $A_xM_yX_z$. Here, "A" includes, for example, at least one selected from the group consisting of Mn, Fe, Co, Ni, Cu, Zn, Mg, Al, and Ga. "A" may include at least one selected from the group consisting of Mn, Fe, Co, Ni, Cu, Zn, Mg, Al, Ti, and Ga. "M" includes, for example, at least one selected from the group consisting of Si, Ge, Al, and Ga. "X" includes, for example, at least one selected from the group consisting of N, P, and As.

"M" mentioned above includes an element different from "A". Thereby, compounds expressed by $A_xM_yX_z$ have the chalcopyrite structure.

In the embodiment, "A" may include a transition element. For example, a transition element is used as A. In the case where a plurality of kinds of elements (e.g. an element α and an element β) are used as A, at least one of the plurality of kinds of elements may be a transition element. For example, a material expressed by $(\alpha_{x1}\beta_{1-x1})_xM_yX_z$ may be used as the memory layer 15, and at least one of the element α and the element β is a transition element. That is, "A" mentioned above is $\alpha_{x1}\beta_{1-x1}$ (0≤x1≤1), and at least one of α and β is a transition element.

Figure 2:
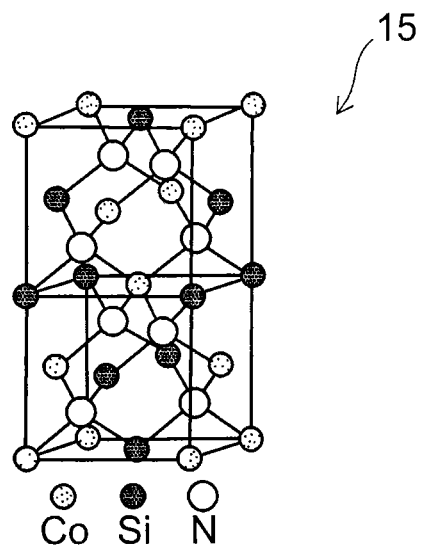
FIG. 2 is a schematic view illustrating the configuration of the nonvolatile memory device according to the first embodiment.

FIG. 2 is a schematic view illustrating the configuration of a nonvolatile memory device according to the first embodiment.

FIG. 2 illustrates the crystal structure of the memory layer 15. In the example, "A" is Co, "M" is Si, and "X" is N. As shown in FIG. 2, the memory layer 15 has the chalcopyrite structure.

It has been found that when, for example, a resistance change element using an oxide is exposed to a semiconductor process, the characteristics of the resistance change element may change greatly. For example, it has been found that the oxide used for the resistance change element alters due to a severe semiconductor process and desired characteristics are difficult to obtain when an actual device is formed. In particular, when a wet process used in a semiconductor process is performed on the resistance change unit of an oxide, it is difficult to maintain desired characteristics. For example, when the resistance change element undergoes a semiconductor process, the resistance change element is damaged and the number of switching times in the resistance change element is decreased. This is an issue found by the inventor of the application through experiment, and the embodiment solves the newly found issue.

In the nonvolatile memory device 110 according to the embodiment, a compound having the chalcopyrite structure is used as the memory layer 15. Since elements are strongly bonded in the compound having the chalcopyrite structure, the compound has high process tolerance. In the embodiment, good and stable characteristics can be maintained even after going through various processes as compared to the case where a relatively unstable material such as an oxide is used as the memory layer 15.

Examples of the operation in the nonvolatile memory device 110 according to the embodiment will now be described in a model way.

Figure 3:
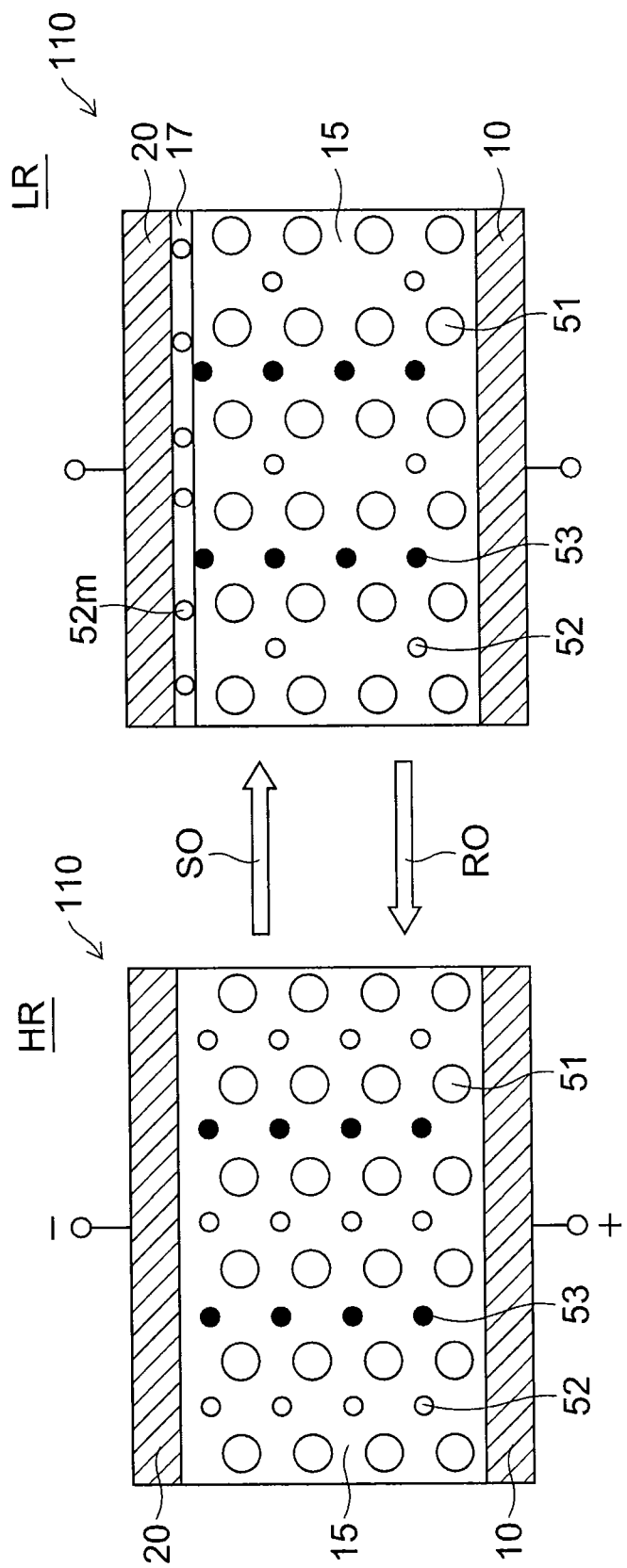
FIG. 3 is a schematic view illustrating operations of the nonvolatile memory device according to the first embodiment.

FIG. 3 is a schematic view illustrating operations of the nonvolatile memory device according to the first embodiment.

As shown in FIG. 3, the memory layer 15 has a low resistance state (a low resistance state LR) with a low resistance (resistivity) and a high resistance state (a high resistance state HR) with a higher resistance (resistivity) than the low resistance state. The memory layer 15 can reversibly transition between the low resistance state LR and the high resistance state HR.

In the following, a description is given on the assumption that the initial state of the memory layer 15 is the high resistance state HR.

The memory layer 15 is changed into the low resistance state LR by a potential gradient provided to the memory layer 15; thereby, the programming of information is performed.

The memory layer 15 includes cations of which the positions are fixed (first cations 51), cations that can move (second cations 52), and anions 53. For example, the element of "M" mentioned above is used as the first cation 51, the element of "A" mentioned above is used as the second cation 52, and the element of "X" mentioned above is used as the anion 53. At least a part of the second cations 52 is, for example, a transition element. That is, the valence of the second cation 52 can change.

First, for example, a state is created in which the potential of the second conductive unit 20 is lower than the potential of the first conductive unit 10. For example, the first conductive unit 10 is set at a fixed potential (e.g. the ground potential) and a negative potential is applied to the second conductive unit 20. Thereby, a part of the second cations 52 moves toward the second conductive unit 20 (cathode) in the crystal (in the memory layer 15). In the memory layer 15 that is a crystal, the number of second cations 52 becomes smaller than the number of anions 53.

The second cations 52 that have moved to the side of the second conductive unit 20 receive electrons from the second conductive unit 20, and deposit as metal atoms 52m to form a metal layer 17, for example. That is, in a region near the second conductive unit 20 of the memory layer 15, the second cation 52 is reduced and behaves like a metal. Thereby, the electric resistance decreases.

On the other hand, in the memory layer 15, since the amount of anions 53 becomes excessive, the valence of the second cation 52 that is left in the memory layer 15 increases. Thereby, electron conductivity occurs in the memory layer 15. Consequently, the condition changes into the low resistance state LR as the whole memory layer 15. The operation is referred to as a set operation SO. The set operation SO is, for example, the program operation.

The reading of programmed information is performed by, for example, applying a voltage pulse to the memory layer 15 and detecting the resistance value of the memory layer 15. At this time, the magnitude of the voltage pulse is set to such a small value that the resistance of the memory layer 15 does not change.

The process described above is a kind of electrolysis. For example, an oxidizing agent is produced on the side of the first conductive unit 10 (anode) due to electrochemical oxidation, and a reducing agent is produced on the side of the second conductive unit 20 (cathode) due to electrochemical reduction.

On the other hand, in an operation that returns the low resistance state LR to the high resistance state HR (a reset operation RO), for example, a large current pulse is applied to the memory layer 15, and the resulting Joule heat is used to heat the memory layer 15 to promote the redox reaction of the memory layer 15. Due to the Joule heat, the second cations 52 return into the thermally stable crystal structure (into the memory layer 15), and the initial high resistance state HR appears. The reset operation RO is, for example, the erase operation.

The reset operation RO can be performed also by applying a voltage pulse with a polarity opposite to that of the set operation SO. For example, the first conductive unit 10 is set at a fixed potential, and a positive potential is applied to the second conductive unit 20. Thereby, the metal atoms 52m near the second conductive unit 20 give electrons to the second conductive unit 20 to become the second cations 52. The second cations 52 return into the memory layer 15 due to the potential gradient in the memory layer 15. Thereby, the condition changes into the initial high resistance state HR.

Thus, the program operation and the erase operation, that is, the set operation SO and the reset operation RO of the nonvolatile memory device 110 according to the embodiment are performed.

In the embodiment, for example, a current based on the movement of cations in a compound (crystal) having the chalcopyrite structure is utilized. To facilitate the movement of cations, an anion with a large ionic radius is used. For example, by using at least one selected from the group consisting of N, P, and As as "X", the ionic radius of the anion can be increased and cations can move easily.

In the case where an oxide is used as the memory layer 15, an oxygen ion serves as the anion. The ionic radius of the oxygen ion (anion) is small, and cations move less easily. Consequently, in the configuration, it is considered that good switching is difficult to obtain.

In the nonvolatile memory device 110 according to the embodiment, by using a configuration that facilitates the movement of cations, good and stable electrical characteristics can be obtained.

By using a material of a nitride as the memory layer 15, process tolerance is easily improved. Thus, by using a trivalent element such as N, P, and As (an element that forms the anion 53) as "X", process tolerance is easily improved.

In the embodiment, a non-oxide is used as the memory layer 15. Tolerance is improved by increasing the valence of the anion. For example, a skeleton including silicon and nitrogen is stronger than a skeleton including silicon and oxygen. Furthermore, nitrogen has a larger ionic radius than oxygen. Using nitrogen enlarges the path for the passage of cations (e.g. Co ions) through the crystal structure, and facilitates the movement of cations. Thereby, switching probability is increased. Furthermore, endurance is improved.

Examples of the compound having the chalcopyrite structure include $CuInSe_2$ etc. Using the compound for solar cells etc. is investigated. In this case, a mechanism in which an electron is excited and the excited electron moves is utilized. That is, in solar cells, not a mechanism of ions moving but a current based on the movement of electrons is utilized. In contrast, in the nonvolatile memory device 110 according to the embodiment, the movement of ions (e.g. cations) in a compound having the chalcopyrite structure is utilized.

For example, materials having the spinel structure can be used as materials of batteries, and a mechanism in which ions move in the structure is known. However, a device utilizing the movement of ions in a compound having the chalcopyrite structure is not known for the present. In the embodiment, the change in resistance based on the movement of ions in the chalcopyrite structure is utilized.

In the embodiment, "A" may include a transition element in the case where the memory layer 15 includes a material expressed by $A_xM_yX_z$ mentioned above; thereby, for example, the retention time in the storage operation can be increased.

Examples of the characteristics of the material in regard to the memory layer 15 will now be described. In the following, in regard to materials with various compositions, the switching probability after DHF (diluted hydrofluoric acid diluted 100 times) treatment is described as process tolerance.

In the samples, a disc made of a glass substrate with a diameter of approximately 60 mm and a thickness of approximately 1 mm is used. A lower electrode layer is provided on the disc, a sample layer that forms the memory layer 15 is provided on the lower electrode layer, and an upper electrode layer (protection layer) is provided thereon. A Pt film with a thickness of 500 nm is used as the lower electrode layer and the upper electrode layer (protection layer).

The memory layer 15 can be formed by RF magnetron sputtering in a prescribed atmosphere using a prescribed target including a material that forms the memory layer 15. The temperature of the disc in the formation of the memory layer 15 is kept at a value in the range from 300° C. to 600° C. The thickness of the memory layer 15 is approximately 10 nm. The memory layer 15 is, after formed, brought into contact with the DHF mentioned above for one minute.

A probe of tungsten (W) is brought into contact with the upper electrode layer to pass a current through the memory layer 15. The diameter of the tip of the probe is about 10 nm. In the program operation, a voltage pulse of 10 nanoseconds (ns) and 1 volt (V) is applied between the lower electrode layer and the probe. In the erase operation, a voltage pulse of 100 ns and 0.1 V is applied between the lower electrode layer and the probe. The number of switching times SWN (cycles) when the ratio of the resistance value of the high resistance stare HR to the resistance value of the low resistance state LR in the memory layer 15 (ON/OFF ratio) is not less than 1,000 when the program operation and the erase operation are repeatedly performed is used as the evaluation value.

In a first sample, $CoSiN_2$ is used as the memory layer 15. The memory layer 15 in the first sample is formed by using an alloy target of Co:Si=1:1 and performing RF magnetron sputtering in an atmosphere containing 50% Ar and 50% $N_2$.

In the first sample, the number of switching times SWN is not less than 10,000 cycles at ten current passage points.

In the following samples, the matters not described are similar to those of the first sample mentioned above.

In a second sample, $MnSiN_2$ is used as the memory layer 15.

In a third sample, $FeSiN_2$ is used as the memory layer 15.

In a fourth sample, $Fe_{0.7}SiN_2$ is used as the memory layer 15.

In a fifth sample, $MnGeN_2$ is used as the memory layer 15.

In a sixth sample, $FeGeN_2$ is used as the memory layer 15.

In a seventh sample, $CoGeN_2$ is used as the memory layer 15.

In an eight sample, $Fe_{0.7}GeN_2$ is used as the memory layer 15.

In a ninth sample, $CoSiP_2$ is used as the memory layer 15.

In a tenth sample, $MnSiP_2$ is used as the memory layer 15.

In an eleventh sample, $FeSiP_2$ is used as the memory layer 15.

In a twelfth sample, $Fe_{0.7}SiP_2$ is used as the memory layer 15.

In a thirteenth sample, $MnGeP_2$ is used as the memory layer 15.

In a fourteenth sample, $FeGeP_2$ is used as the memory layer 15.

In a fifteenth sample, $CoGeP_2$ is used as the memory layer 15.

In a sixteenth sample, $Fe_{0.7}GeP_2$ is used as the memory layer 15.

In a seventeenth sample, $Co_{0.5}Zn_{0.5}SiN_2$ is used as the memory layer 15.

In an eighteenth sample, $Mn_{0.5}Zn_{0.5}SiN_2$ is used as the memory layer 15.

In a nineteenth sample, $Fe_{0.5}Zn_{0.5}SiN_2$ is used as the memory layer 15.

In a twentieth sample, $Fe_{0.5}Zn_{0.25}SiN_2$ is used as the memory layer 15.

In the second to twentieth samples above, the number of switching times SWN is not less than 10,000 cycles at ten current passage points.

In a twenty-first sample, $ZnV_2O_4$ is used as the memory layer 15.

In a twenty-second sample, $ZnCr_2O_4$ is used as the memory layer 15.

In a twenty-third sample, $ZnMn_2O_4$ is used as the memory layer 15.

In a twenty-fourth sample, $ZnCo_2O_4$ is used as the memory layer 15.

In a twenty-fifth sample, $MgCr_2O_4$ is used as the memory layer 15.

In a twenty-sixth sample, $MgMn_2O_4$ is used as the memory layer 15.

In each of the twenty-first to twenty-sixth samples, when the probe is brought into contact with 1,000 points of the sample, the number of points at which an ON/OFF ratio of not less than 1,000 is obtained is two, one, two, four, six, and seven, respectively. In the twenty-first to twenty-sixth samples, the switching probability of one cycle is less than 70%.

In the first to twentieth samples, the memory layer 15 has the chalcopyrite structure. In the twenty-first to twenty-sixth samples, the memory layer 15 does not have the chalcopyrite structure. Thus, when the memory layer 15 has the chalcopyrite structure, good electrical characteristics are obtained even after going through a process such as DHF treatment.

Thus, the memory layer 15 includes, for example, at least one selected from the group consisting of cobalt nitride, manganese siliconitride, iron siliconitride, germanium manganese nitride, germanium iron nitride, germanium cobalt nitride, cobalt silicophosphide, manganese silicophosphide, iron silicophosphide, germanium manganese phosphide, germanium iron phosphide, germanium cobalt phosphide, cobalt zinc siliconitride, manganese zinc siliconitride, and iron zinc siliconitride.

Further, in the case where $TiSiN_2$ is used as the memory layer 15, the number of switching times SWN is not less than 10,000 cycles at ten current passage points.

In the embodiment, the composition ratio x of $A_xM_yX_z$ included in the memory layer 15 satisfies, for example, $0.3 \leq x \leq 1$. The composition ratio y mentioned above satisfies $0.9 \leq y \leq 1.1$. Furthermore, $1.9 \leq (z/y) \leq 2.1$ is satisfied.

Thereby, a memory layer 15 with high process tolerance is easily obtained. Thus, a nonvolatile memory device that maintains high performance can be provided.

Examples of the characteristics of the memory layer 15 when the composition ratio x, the composition ratio y, and the composition ratio z are changed will now be described.

FIG. 4 is a table illustrating characteristics of the nonvolatile memory device.

FIG. 4 shows the evaluation Ev of the number of switching times (lifetime) when the composition ratio x, the composition ratio y, and the composition ratio z are changed in the compound $A_xM_yX_z$ having the chalcopyrite structure. Here, the case where the number of switching times SWN when an ON/OFF ratio of not less than 1,000 can be maintained is not less than 10,000 cycles when the mutual transition (switching) between the low resistance state and the high resistance state is repeated in the memory layer 15 is a state where good characteristics are obtained. The case where the number of switching times SWN is less than 10,000 cycles is a state where the characteristics are not good.

In FIG. 4, the state where good characteristics are obtained is expressed as "O" for "the evaluation Ev". The state where the characteristics are not good is expressed as "X" for "the evaluation Ev". FIG. 4 shows examples in which Co is used as "A", Si is used as "M", and N is used as "X".

As can be seen from FIG. 4, good characteristics are not obtained when the composition ratio x is not more than 0.29 or not less that 1.01 (the evaluation Ev being "X"). Even when the composition ratio x is not less than 0.31 and not more than 0.99, good characteristics are not obtained when the composition ratio y is not more than 0.89 or not less than 1.11 (the evaluation Ev being "X").

In contrast, when the composition ratio x is not less than 0.31 and not more than 0.99 and the composition ratio y is not less than 0.91 and not more than 1.09, conditions whereby good characteristics are obtained exist depending on the value of the composition ratio z (the evaluation Ev being "O").

FIG. 5 is a graph illustrating characteristics of the nonvolatile memory device.

FIG. 5 shows the relationships between the composition ratio y and the composition ratio z and the evaluation Ev for the samples illustrated in FIG. 4 with composition ratios x of not less than 0.31 and not more than 0.99. The horizontal axis of FIG. 5 is the composition ratio y, and the vertical axis of FIG. 5 is the composition ratio z. The expression of "O" in FIG. 5 indicates that good characteristics are obtained (the number of switching times SWN is not less than 10,000 cycles), and the expression of "X" in FIG. 5 indicates that the characteristics are not good (the number of switching times SWN are less than 10,000 cycles).

As can be seen from FIG. 5, good characteristics are not obtained when the composition ratio y is not more than 0.89 or not less than 1.11, and on the other hand good characteristics are obtained when the composition ratio y is not less than 0.91 and not more than 1.09. From this, it is considered that good characteristics are obtained when $0.9 \leq y \leq 1.1$.

The condition of the composition ratio z whereby good characteristics are obtained changes with the composition ratio y. That is, in the example, good characteristics are obtained when $1.9y \leq z \leq 2.1y$. That is, good characteristics are obtained when $1.9 \leq (z/y) \leq 2.1$.

Although FIG. 4 shows examples in which "A" is Co, "M" is Si, and "X" is N, a similar tendency is exhibited also when A is Mn, Fe, Ni, Cu, Zn, Mg, Al, or Ga. Furthermore, a similar tendency is exhibited also when M is Ge, Al, or Ga. Furthermore, a similar tendency is exhibited also when X is P or As.

From the above, in the embodiment, in the case where a material expressed by $A_xM_yX_z$ mentioned above is used as the memory layer 15, the conditions are preferably set to those that satisfy $0.3 \leq x \leq 1$, $0.9 \leq y \leq 1.1$, and $1.9 \leq (z/y) \leq 2.1$. Thereby, good switching characteristics are more easily obtained.

"X" may include a 1% or less halogen element. By "X" including a halogen element, for example, the crystallization temperature is decreased. Furthermore, by "X" including a halogen element, the variation in switching characteristics can be reduced.

In the embodiment, at least one of the first conductive unit 10 and the second conductive unit 20 preferably includes at least one of Si and the group III-V compound semiconductors doped with an impurity.

Si has the diamond structure. The diamond structure is similar to the chalcopyrite structure. The group III-V compound semiconductors have the wurtzite structure or the zinc blende structure. Also these crystal structures are similar to the chalcopyrite structure. The state of the bonding of elements in Si and the group III-V compound semiconductors is similar to the state of the bonding of elements in the memory layer 15. At least one of the first conductive unit 10 and the second conductive unit 20 preferably has the diamond structure, the wurtzite structure, or the zinc blende structure.

By using a material having a crystal structure similar to the crystal structure in the memory layer 15 as at least one of the first conductive unit 10 and the second conductive unit 20, for example, the level of crystal defects in the memory layer 15 can be reduced as compared to the case where other materials are used. Furthermore, degradation of the crystal at the interface between the first conductive unit 10 and the memory layer 15 and the interface between the second conductive unit 20 and the memory layer 15 can be suppressed. Thereby, good electrical characteristics are easily obtained.

Examples of the characteristics of materials used for the first conductive unit 10 and the second conductive unit 20 will be described.

FIG. 6 is a table illustrating the characteristics of the nonvolatile memory device.

FIG. 6 shows the configuration of the memory layer 15 and the electrode layer in a twenty-seventh sample SP 27 to a fiftieth sample SP50. The electrode layer corresponds to the first conductive unit 10 and the second conductive unit 20. These samples correspond to the case where the material of the first conductive unit 10 is the same as the material of the second conductive unit 20.

In these samples, a disk made of a glass substrate with a diameter of about 60 mm and a thickness of about 1 mm is used. The lower electrode layer is provided on the disk, the sample layer forming the memory layer 15 is provided on the lower electrode layer, and the upper electrode layer is provided thereon. Various materials shown in FIG. 6 are used as the lower electrode layer and the upper electrode layer.

The memory layer 15 is formed by RF magnetron sputtering using a prescribed target including a law material forming the memory layer 15 shown in FIG. 6. The temperature of the disk during formation of the memory layer 15 is maintained at a value within the range of 300° C. to 600° C. A thickness of the memory layer 15 is about 10 nm.

A probe of tungsten (W) is caused to contact the upper electrode layer and a current is passed through the memory layer 15. A voltage (set voltage) at which the set operation is performed at this time and a voltage (reset voltage) at which the reset operation is performed are evaluated. The standard deviation σ of the absolute value of a difference between the set voltage and the reset voltage is derived. The small standard deviation σ indicates small variation of the operation voltage. The small standard deviation σ indicates that the stable operation is possible.

As shown in FIG. 6, in the twenty-seventh sample SP27 to the forty-fourth sample SP44, the standard deviation σ is smaller than 0.05 V. On the other hand, in the fourth-fifth sample SP45 to the fiftieth sample SP50, the standard deviation σ is relatively large.

In this manner, the standard deviation σ varies depending on the materials used for the electrode layer (the first conductive unit 10 and the second conductive unit 20).

As shown in FIG. 6, use of materials having the zinc blende structure or the wurtzite structure for the electrode layer (at least one of the first conductive unit 10 and the second conductive unit 20) reduces the standard deviation σ of the operation voltage and allows the stable operation to be possible.

For example, it is favorable to use $Al_{1-u1}Ga_{u1}N_{1-v1}C_{v1}$ ($0 \leq u1 \leq 0.75$, $0 < v1 \leq 0.05$) for the electrode layer (at least one of the first conductive unit 10 and the second conductive unit 20). It is favorable to use $Al_{1-u2-v2}Ga_{u2}Ge_{v2}N$ ($0 \leq u2 \leq 0.75$, $0 < v2 \leq 0.05$) for the electrode layer (at least one of the first conductive unit 10 and the second conductive unit 20). This allows the stable operation to be possible.

Materials like this have the zinc blende structure or the wurzite structure. When these materials are used as the electrode layer, the crystal structure of the electrode layer is similar to the crystal structure (chalcopyrite structure) of the memory layer 15. It is considered that this reduces the standard deviation σ of the voltage.

Second Embodiment

A nonvolatile memory device according to the embodiment has a cross-point configuration.

Figure 7:
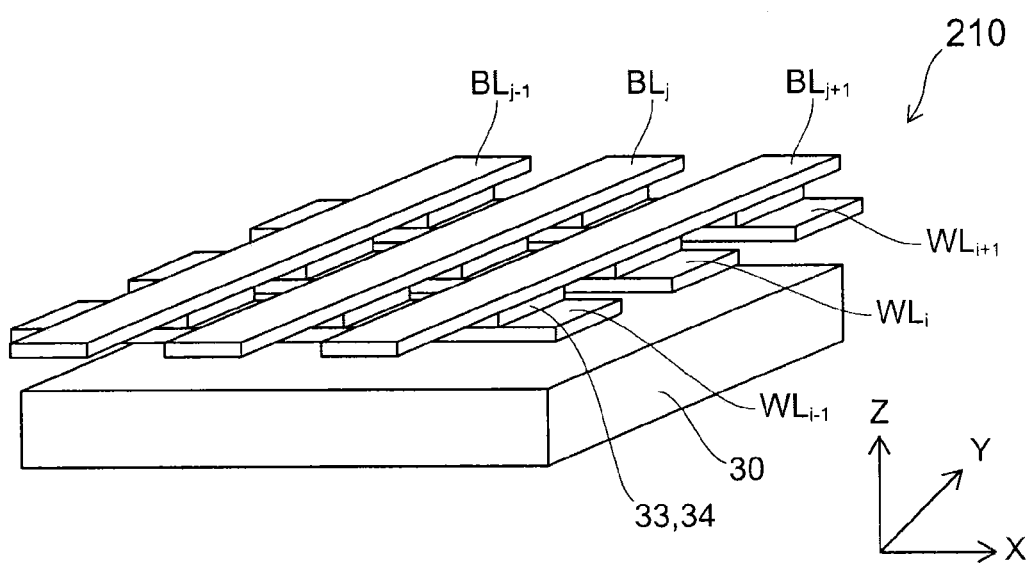
FIG. 7 is a schematic perspective view illustrating the configuration of a nonvolatile memory device according to a second embodiment.

FIG. 7 is a schematic perspective view illustrating the configuration of a nonvolatile memory device according to a second embodiment.

Figure 8:
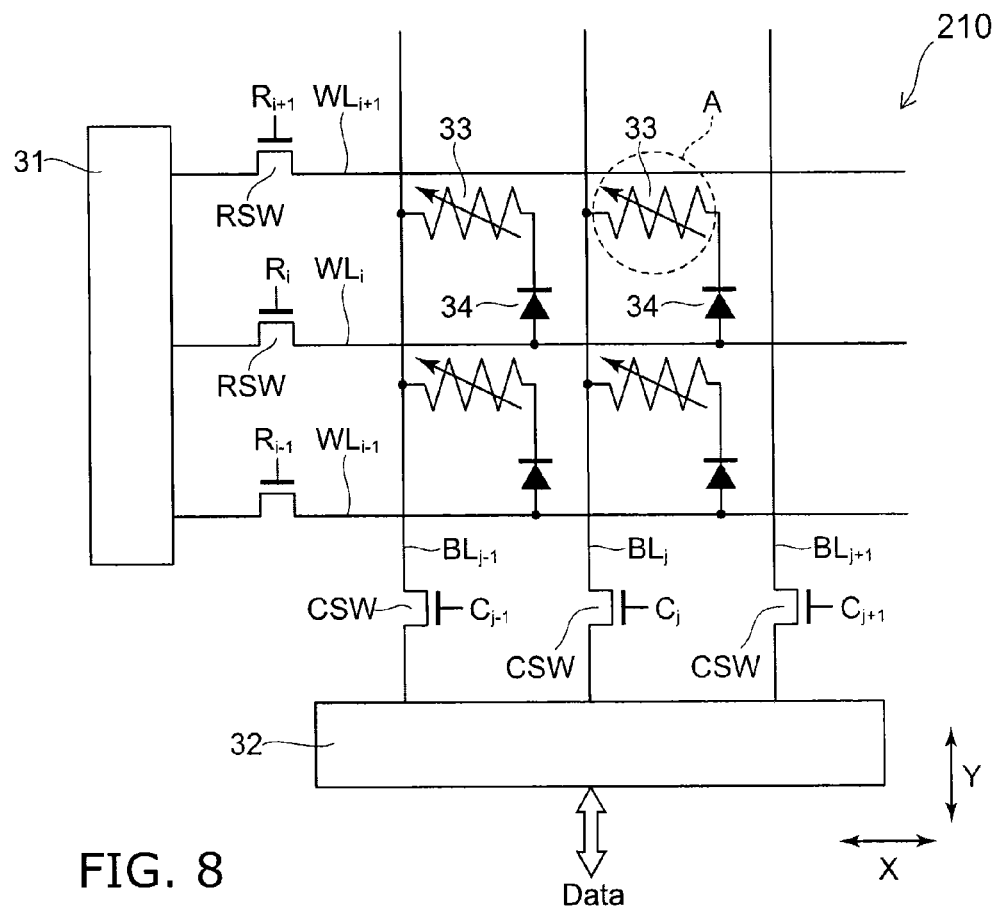
FIG. 8 is a schematic diagram illustrating the configuration of the nonvolatile memory device according to the second embodiment.

FIG. 8 is a schematic diagram illustrating the configuration of the nonvolatile memory device according to the second embodiment.

As shown in FIG. 7 and FIG. 8, a nonvolatile memory device 210 according to the embodiment includes a substrate 30. A plane parallel to the major surface of the substrate 30 is taken as the X-Y plane. One direction in the X-Y plane is taken as the X-axis direction. The direction perpendicular to the X-axis direction in the X-Y plane is taken as the Y-axis direction. The direction perpendicular to the X-axis direction and the Y-axis direction is taken as the Z-axis direction.

In the nonvolatile memory device 210, first interconnections (word lines $WL_{i-1}$, $WL_i$, and $WL_{i+1}$) with band shapes extending in the X-axis direction are provided on the major surface of the substrate 30. Furthermore, second interconnections (bit lines $BL_{j-1}$, $BL_j$, and $BL_{j+1}$) with band shapes extending in the Y-axis direction are provided. The second interconnections (the bit lines $BL_{j-1}$, $BL_j$, and $BL_{j+1}$) oppose the first interconnections (the word lines $WL_{i-1}$, $WL_i$, and $WL_{i+1}$).

Although in the above the extending direction of the first interconnection is orthogonal to the extending direction of the second interconnection, it is sufficient that the extending direction of the first interconnection crosses (be nonparallel to) the extending direction of the second interconnection.

In the above, the subscript i and the subscript j are arbitrary. That is, the number of first interconnections and the number of second interconnections are arbitrary.

In the specific example, the first interconnection forms the word line, and the second interconnection forms the bit line. However, the first interconnection may be the bit line, and the second interconnection may be the word line. In the following, a description is given on the assumption that the first interconnection is the word line and the second interconnection is the bit line.

As shown in FIG. 7 and FIG. 8, a memory cell 33 is provided between the first interconnection and the second interconnection.

As shown in FIG. 8, for example, one end of each of the word lines $WL_{i-1}$, $WL_i$, and $WL_{i+1}$ is connected to a word line driver 31 having the decoder function via a MOS transistor RSW that is a select switch. One end of each of the bit lines $BL_{j-1}$, $BL_j$, and $BL_{j+1}$ is connected to a bit line driver 32 having the decoder and read functions via a MOS transistor CSW that is a select switch.

Select signals $R_{i-1}$, $R_i$, and $R_{i+1}$ for selecting word lines (rows) are inputted to the gates of the MOS transistors RSW, and select signals $C_{j-1}$, $C_j$, and $C_{j+1}$ for selecting bit lines (columns) are inputted to the gates of the MOS transistors CSW.

The memory cell 33 is disposed in the cross portion where the word lines $WL_{i-1}$, $WL_i$, and $WL_{i+1}$ and the bit lines $BL_{j-1}$, $BL_j$, and $BL_{j+1}$ oppose each other. A rectifying element 34 for preventing a sneak current in programming/reading may be added to the memory cell 33. The rectifying element 34 is provided at least one of between the word line WL and the memory layer 15 and between the bit line BL and the memory layer 15.

Figure 9:
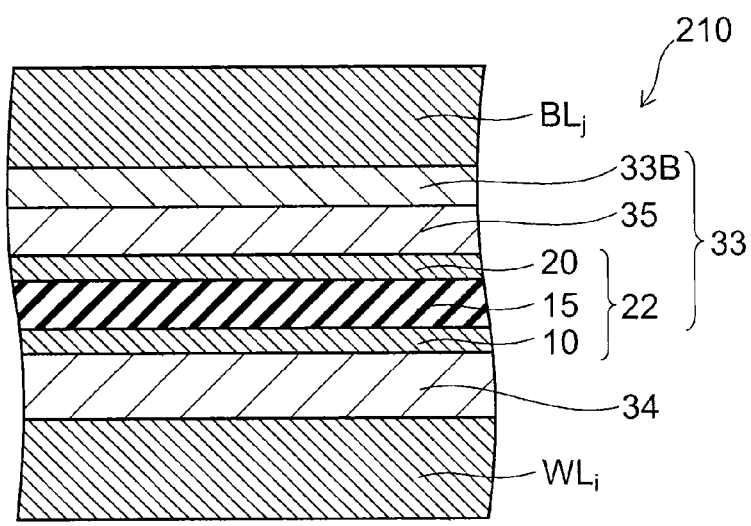
FIG. 9 is a schematic cross-sectional view illustrating the configuration of a part of the nonvolatile memory device according to the second embodiment.

FIG. 9 is a schematic cross-sectional view illustrating the configuration of a part of the nonvolatile memory device according to the second embodiment.

As shown in FIG. 9, the memory cell 33 and the rectifying element 34 are provided between the word line $WL_i$ and the bit line $BL_j$. The relationship of the vertical arrangement of the word line $WL_i$ and the bit line $BL_j$ is arbitrary. The order of the arrangement of the memory cell 33 and the rectifying element 34 between the word line $WL_i$ and the bit line $BL_j$ is arbitrary.

As shown in FIG. 9, the memory cell 33 includes a memory unit 22. The memory unit 22 includes the first conductive unit 10, the second conductive unit 20, and the memory layer 15 provided between the first conductive unit 10 and the second conductive unit 20. The configuration described in regard to the first embodiment can be used for the memory layer 15.

The memory cell 33 may further include a protection layer 33B. Although the protection layer 33B is provided on the bit line $BL_j$ side of the memory unit 22 in the specific example, the protection layer 33B may be provided on the word line $WL_i$ side of the memory unit 22, and may be provided between the rectifying element 34 and the word line $WL_i$. The memory cell 33 may further include a heater layer 35 provided between the memory unit 22 and the protection layer 33B. The heater layer 35 and the protection layer 33B are provided as necessary and may be omitted.

At least one of, for example, the word line $WL_i$, the rectifying element 34, the heater layer 35, the protection layer 33B, and the bit line $BL_j$ adjacent to the memory unit 22 may be used as at least one of the first conductive unit 10 and the second conductive unit 20.

Figure 10:
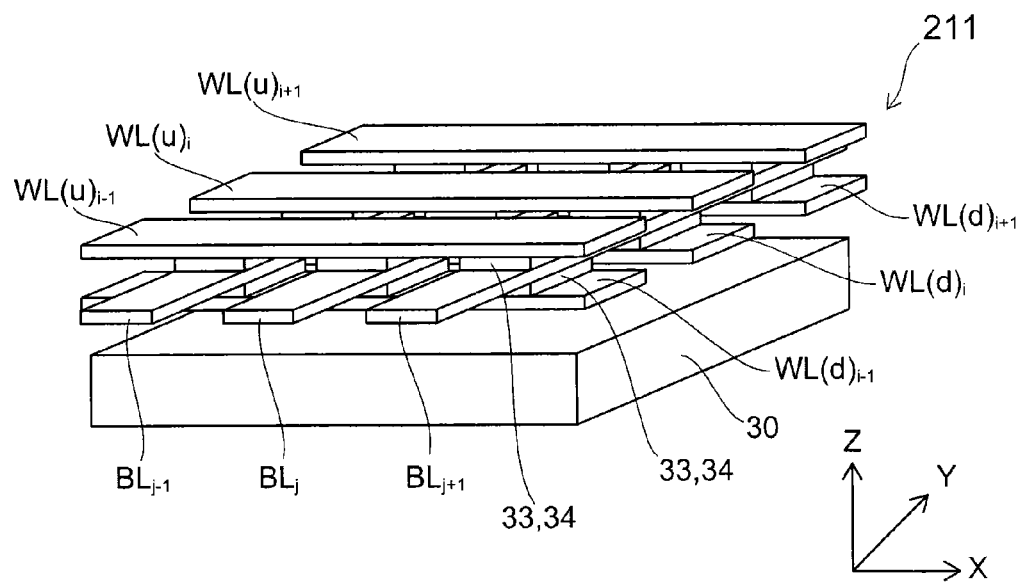
FIG. 10 is a schematic perspective view illustrating the configuration of another nonvolatile memory device according to the second embodiment.
Figure 11:
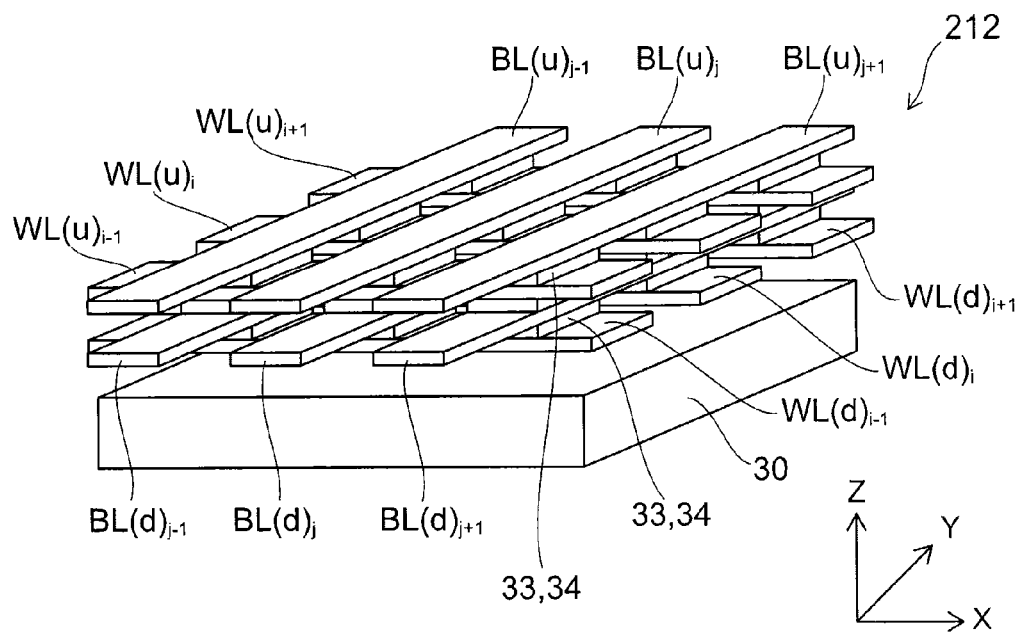
FIG. 11 is a schematic perspective view illustrating the configuration of another nonvolatile memory device according to the second embodiment.

FIG. 10 and FIG. 11 are schematic perspective views illustrating the configurations of other nonvolatile memory devices according to the second embodiment.

As shown in FIG. 10 and FIG. 11, in nonvolatile memory devices 211 and 212 according to the embodiment, a stacked structure body including the word line, the bit line, and the memory cell 33 provided therebetween is stacked in plural. Thereby, three-dimensionally structured nonvolatile memory devices are formed.

In the nonvolatile memory devices 210, 211, and 212 according to the embodiment, the word line driver 31 and the bit line driver 32 serving as a drive unit perform at least one of applying a voltage to the memory layer 15 and passing a current through the memory layer 15 via the word line $WL_i$ and the bit line $BL_j$. Thereby, a change is produced in the memory layer 15 to program information. For example, the drive unit applies a voltage to the memory layer 15 to produce a change in the memory layer 15 to program information. Furthermore, programmed information can be read out. Furthermore, erasing can be performed.

Also the nonvolatile memory devices 210, 211, and 212 according to the embodiment can provide a nonvolatile memory device that has high process tolerance and maintains high performance.

Third Embodiment

A nonvolatile memory device according to the embodiment has a probe memory configuration.

Figure 12:
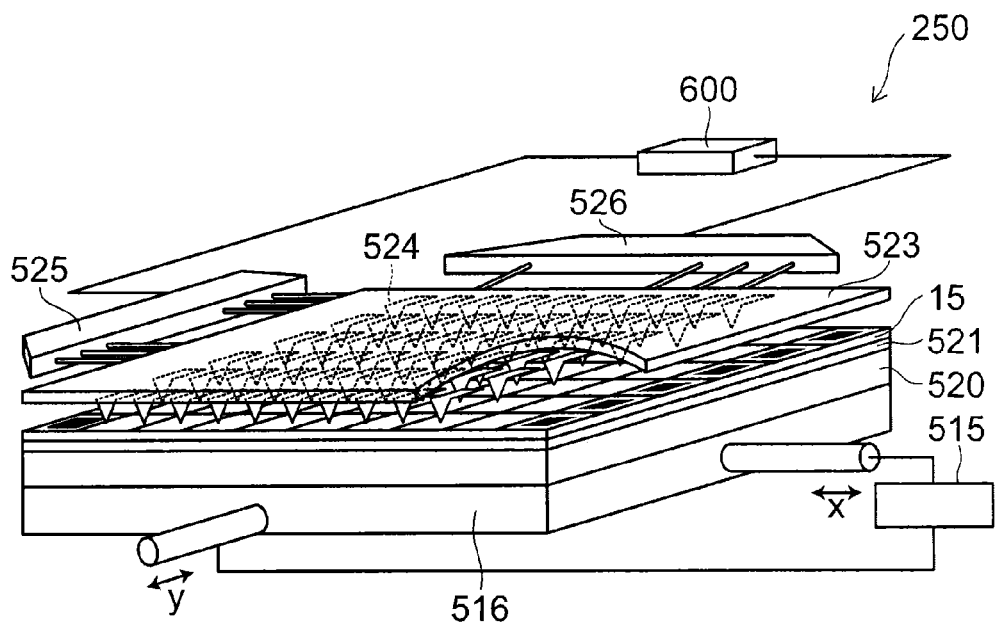
FIG. 12 is a schematic perspective view illustrating the configuration of a nonvolatile memory device according to a third embodiment.

FIG. 12 is a schematic perspective view illustrating the configuration of a nonvolatile memory device according to a third embodiment.

Figure 13:
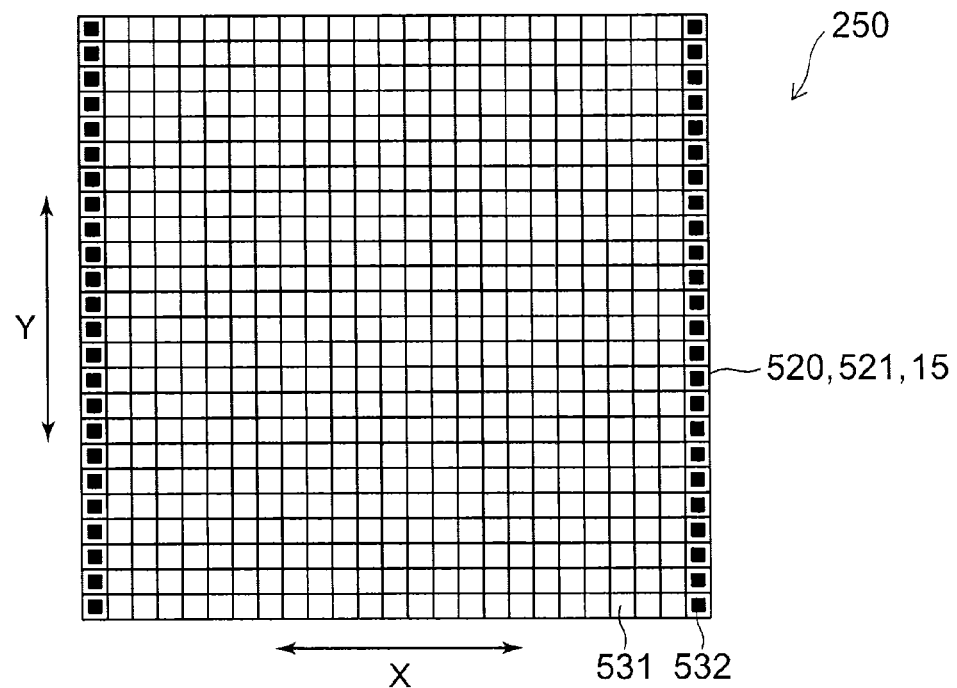
FIG. 13 is a schematic plan view illustrating the configuration of the nonvolatile memory device according to the third embodiment.

FIG. 13 is a schematic plan view illustrating the configuration of the nonvolatile memory device according to the third embodiment.

As shown in FIG. 12 and FIG. 13, in a nonvolatile memory device 250 according to the embodiment, the memory layer 15 provided on an electrode 521 is disposed above an XY scanner 516. A probe array is disposed to oppose the memory layer 15. The electrode 521 is provided on a substrate 520, for example.

The probe array includes, for example, a substrate 523 and a plurality of probes (heads) 524 disposed in an array configuration on one side of the substrate 523. A cantilever, for example, is used as the probe 524. The plurality of probes 524 are driven by multiplex drivers 525 and 526.

The plurality of probes 524 can be individually operated using a microactuator in the substrate 523. It is also possible to make all the probes 24 collectively perform the same operation to access the data areas 531 of the memory medium (the memory layer 15).

For example, the electrode 521 is used as the first conductive unit 10, and the probe 524 is used as the second conductive unit 20. In the case where a conductive protection layer is provided on the memory layer 15, the protection layer forms the second conductive unit 20.

For example, all the probes 524 are reciprocated in the X direction with a constant period using the multiplex drivers 525 and 526 to read out the positional information in the Y direction from the servo areas 532 of the memory medium (the memory layer 15). The positional information in the Y direction is transmitted to a driver 515.

The driver 515 drives the XY scanner 516 based on the positional information to move the memory medium (the memory layer 15) in the Y direction, and performs the positioning of the memory medium (the memory layer 15) and the probes.

When the positioning of both is completed, the programming, reading, or erasing of data is performed using the probes 524 on/above the data areas 531.

One probe (head) is provided for one data area 531, and one probe is provided for one servo area 532, for example. Each probe 524 is connected to a drive unit 600 via the multiplex drivers 525 and 526, for example. The drive unit 600 supplies at least one of a voltage and a current for information storage to each probe 524. The memory layer 15 transitions between the high resistance state and the low resistance state in accordance with the voltage and current applied via the probe 524. Furthermore, the drive unit 600 detects the high resistance state and the low resistance state stored in the memory layer 15 to read out stored information.

The nonvolatile memory device 250 thus configured includes the memory layer 15 and the drive unit 600 that produces a change in the memory layer 15 by at least one of applying a voltage to the memory layer 15 and passing a current through the memory layer 15 to store information. The nonvolatile memory device 250 further includes the probes 524 provided for the memory layer 15, and the drive unit 600 performs at least one of applying a voltage and passing a current on the memory units of the memory layer 15 via the probes 524. Thereby, a change is produced in the memory layer 15 to store information.

The drive unit 600 may include the driver 515 and the XY scanner 516 mentioned above, or conversely the drive unit may be included in the driver 515 and the XY scanner 516 mentioned above.

Also the nonvolatile memory device 250 of a probe memory type according to the embodiment can provide a nonvolatile memory device that has high process tolerance and maintains high performance.

Fourth Embodiment

A nonvolatile memory device according to the embodiment has a flash memory configuration.

Figure 14:
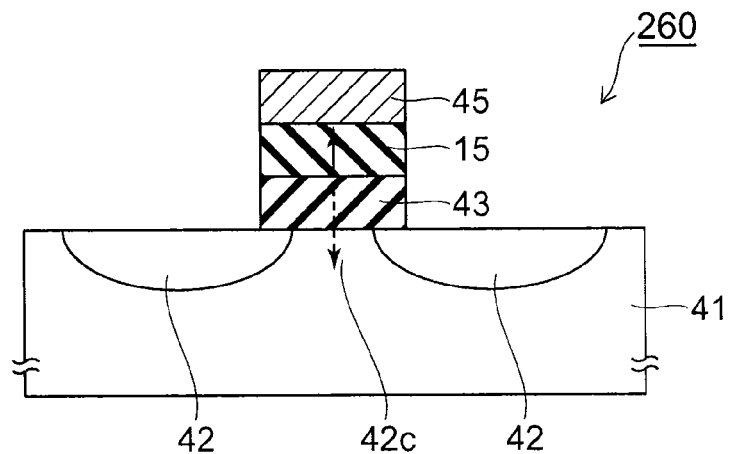
FIG. 14 is a schematic cross-sectional view illustrating the configuration of a nonvolatile memory device according to a fourth embodiment.

FIG. 14 is a schematic cross-sectional view illustrating the configuration of a nonvolatile memory device according to a fourth embodiment.

Figure 15:
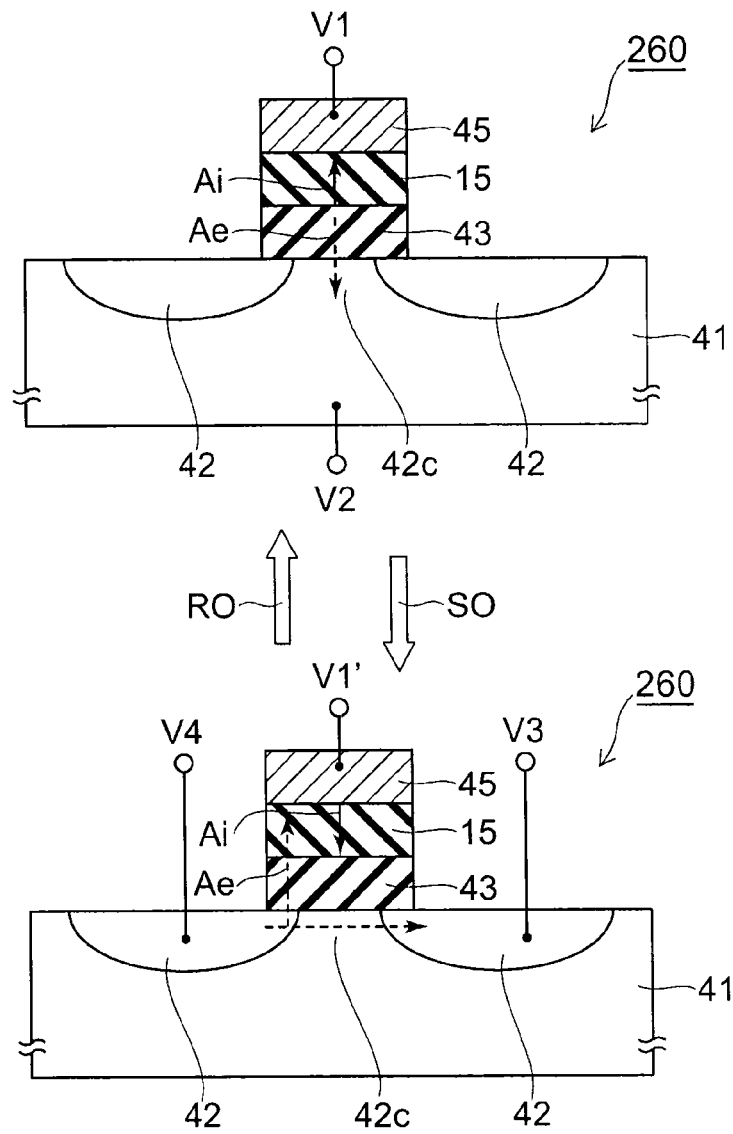
FIG. 15 is a schematic cross-sectional view illustrating operations of the nonvolatile memory device according to the fourth embodiment.

FIG. 15 is a schematic cross-sectional view illustrating operations of the nonvolatile memory device according to the fourth embodiment.

As shown in FIG. 14, a nonvolatile memory device 260 according to the embodiment includes a memory cell of a flash memory type. The memory cell has a configuration of a MIS (metal-insulator-semiconductor) transistor.

A plurality of diffusion layers 42 are formed in the surface region of a semiconductor substrate 41. A channel region 42c is provided between the plurality of diffusion layers 42. A gate insulating layer 43 is formed on the channel region 42c. The memory layer 15 according to the embodiment is formed on the gate insulating layer 43. A control gate electrode 45 is formed on the memory layer 15.

The memory layer 15 has the configuration described in the first embodiment. For example, the channel region 42c may be taken as the first conductive unit 10, and the control gate electrode 45 may be taken as the second conductive unit 20. The memory unit 22 including the first conductive unit 10, the second conductive unit 20, and the memory layer 15 may be provided between the gate insulating layer 43 and the control gate electrode 45. In the following drawings, the memory unit 22 is shown to be omitted as the memory layer 15 as appropriate.

The semiconductor substrate 41 may be a well region. The semiconductor substrate 41 has a conductivity type opposite to the conductivity type of the diffusion layer 42. The control gate electrode 45 forms a word line. A conductive polysilicon, for example, is used for the control gate electrode 45.

In the embodiment, a not-shown drive unit is provided to be connected to the control gate electrode 45. The drive unit performs at least one of applying a voltage to the memory layer 15 and passing a current through the memory layer 15 via the control gate electrode 45.

As shown in FIG. 15, in the set (program) operation SO, a potential V1 is applied to the control gate electrode 45, and a potential V2 is applied to the semiconductor substrate 41.

The difference between the potential V1 and the potential V2 is a magnitude enough to change the memory layer 15, that is, change the resistance. However, the polarity of the potential difference is not limited in particular. That is, either V1>V2 or V1<V2 is possible.

For example, if it is assumed that the memory layer 15 is in the high resistance state HR in the initial state (reset state), the gate insulating layer 43 is thick, and therefore the threshold of the memory cell (MIS transistor) is high.

When the memory layer 15 is changed from this state to the low resistance state LR by applying the potentials V1 and V2, the gate insulating layer 43 becomes thin, and therefore the threshold of the memory cell (MIS transistor) becomes low.

Although the potential V2 was applied to the semiconductor substrate 41, instead the potential V2 may be transmitted from the diffusion layer 42 to the channel region 42c of the memory cell. In the drawing, the arrow Ae expresses the movement of electrons, and the arrow Ai expresses the movement of ions.

On the other hand, in the reset (erase) operation RO, a potential V1' is applied to the control gate electrode 45, a potential V3 is applied to one of the diffusion layers 42, and a potential V4 (<V3) is applied to the other of the diffusion layers 42. The potential V1' is set to a value exceeding the threshold of the memory cell in the set state.

At this time, the memory cell becomes ON, electrons flow from the other of the diffusion layers 42 toward the one, and hot electrons are generated. Since the hot electrons are injected into the memory layer 15 via the gate insulating layer 43, the temperature of the memory layer 15 increases.

Thereby, the memory layer 15 changes from the low resistance state LR to the high resistance state HR, therefore, the gate insulating layer 43 becomes thick, and the threshold of the memory cell (MIS transistor) becomes high.

Thus, the threshold of the memory cell can be changed by a similar principle to flash memory, and the device can be used as a nonvolatile memory device.

In the nonvolatile memory device 260 according to the embodiment, since the memory layer 15 described in regard to the first embodiment is used as the memory layer 15, a nonvolatile memory device that has high process tolerance and maintains high performance can be provided.

Figure 16:
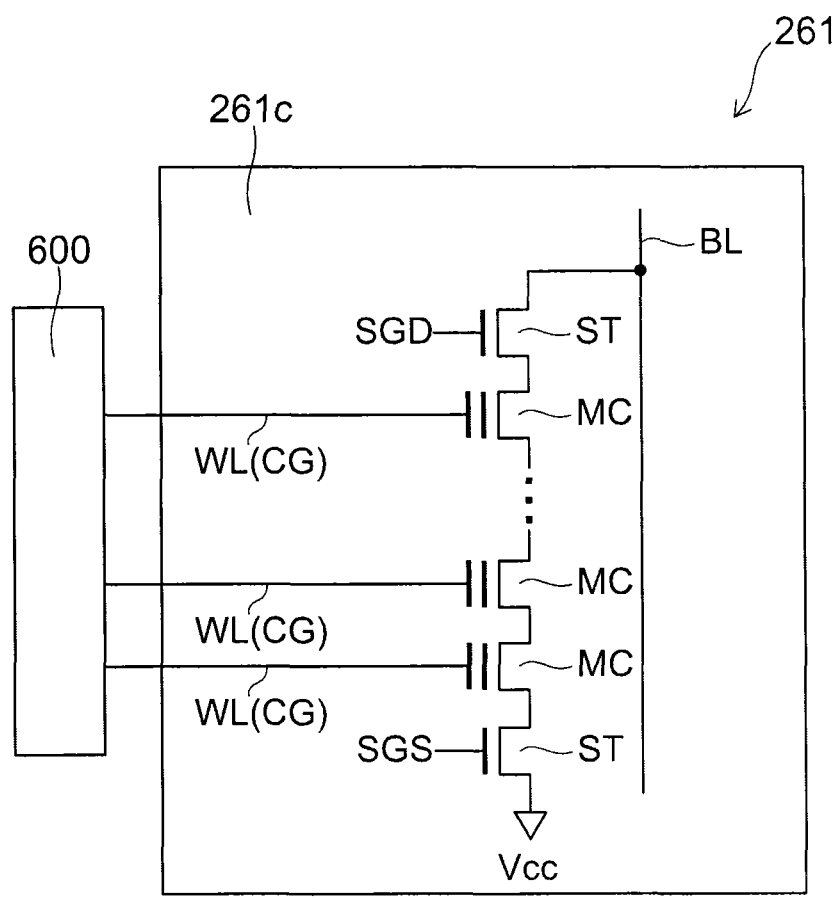
FIG. 16 is a schematic diagram illustrating the configuration of another nonvolatile memory device according to the fourth embodiment.

FIG. 16 is a schematic diagram illustrating the configuration of another nonvolatile memory device according to the fourth embodiment.

Figure 17A:
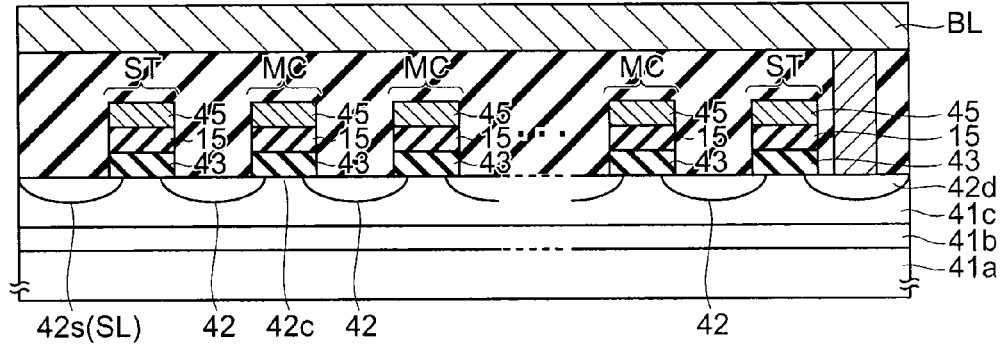
FIG. 17A to FIG. 17C are schematic cross-sectional views illustrating other nonvolatile memory devices according to the fourth embodiment.
Figure 17B:
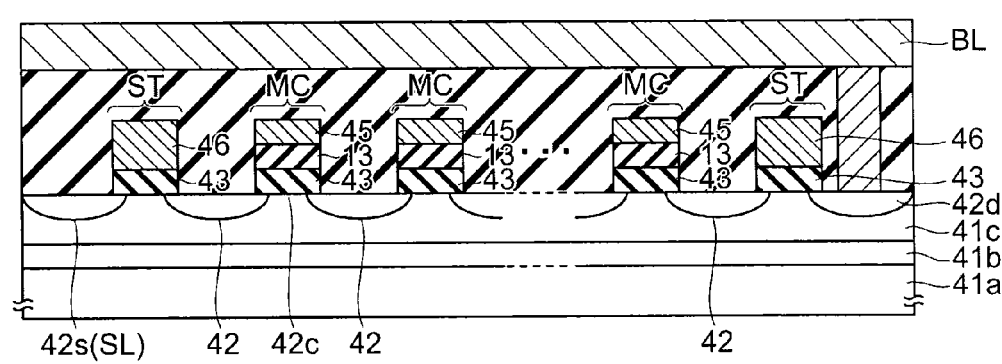
Figure 17C:
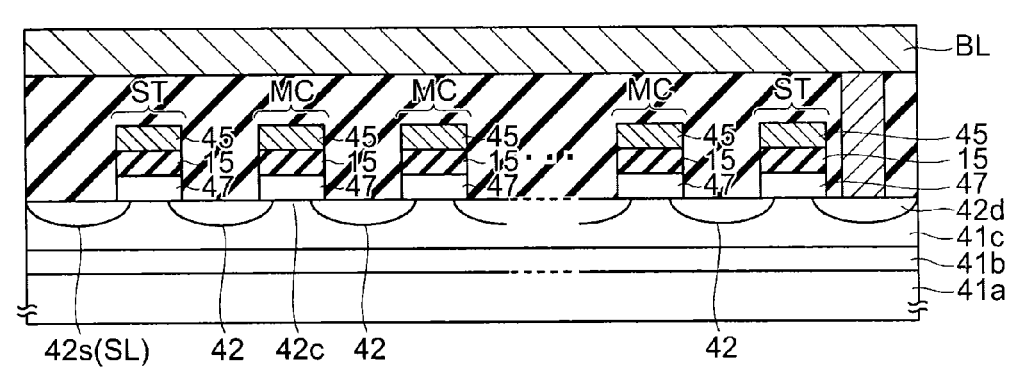

FIG. 17A to FIG. 17C are schematic cross-sectional views illustrating other nonvolatile memory devices according to the fourth embodiment.

Another nonvolatile memory device 261 according to the embodiment is a NAND flash memory. FIG. 16 shows a circuit diagram of a NAND cell unit 261c. FIG. 17A illustrates the structure of the NAND cell unit 261c.

As shown in FIG. 16, the NAND cell unit 261c includes a NAND string composed of a plurality of memory cells MC connected in series and a total of two select gate transistors ST connected to both ends of the NAND string one by one.

As shown in FIG. 17A, an n-type well region 41b and a p-type well region 41c are provided in a p-type semiconductor substrate 41a. The NAND cell unit 261c is formed in the p-type well region 41c.

In the example, the memory cell MC has the same structure as the select gate transistor ST. Specifically, these each include the n-type diffusion layers 42, the gate insulating layer 43 on the channel region 42c between the n-type diffusion layers 42, the memory layer 15 on the gate insulating layer 43, and the control gate electrode 45 on the memory layer 15.

As shown in FIG. 16, each control gate electrode 45 (CG) is electrically connected to the drive unit 600. The drive unit 600 may be provided in the substrate in which the NAND cell unit 261c is provided, or may be provided in a substrate different from the substrate.

The state (the high resistance state HR and the low resistance state LR) of the memory layer 15 of the memory cell MC can be changed by the operations described in regard to FIG. 15. In contrast, the memory layer 15 of the select gate transistor ST is fixed in the set state, that is, the low resistance state LR.

One of the select gate transistors ST is connected to a source line SL, and the other is connected to a bit line BL.

It is assumed that, before the set (program) operation SO, all the memory cells in the NAND cell unit 261c are in the reset state (resistance being large). The set (program) operation SO is performed successively from the memory cell MC on the source line SL side toward the memory cell on the bit line BL side one by one. V1 (a positive potential) is applied to the selected word line (control gate electrode) WL as a program potential, and $V_{pass}$ is applied to the not-selected word lines WL as a transmit potential (a potential at which the memory cell MC becomes ON). The select gate transistor ST on the source line SL side is switched OFF, the select gate transistor ST on the bit line BL side is switched ON, and program data is transmitted from the bit line BL to the channel region 42c of the selected memory cell MC.

For example, when the program data is "1", a program inhibit potential (e.g. a potential approximately equal to V1) is transmitted to the channel region 42c of the selected memory cell MC so that the resistance value of the memory layer 15 of the selected memory cell MC may not change from a high level to a low level.

Furthermore, when the program data is "0", V2 (<V1) is transmitted to the channel region 42c of the selected memory cell MC to change the resistance value of the memory layer 15 of the selected memory cell MC from a high level to a low level.

On the other hand, in the reset (erase) operation RO, for example, V1' is applied to all the word lines (control gate electrodes) WL to switch all the memory cells MC in the NAND cell unit 261c to ON. Furthermore, the two select gate transistors ST are switched ON, V3 is applied to the bit line BL, and V4 (<V3) is applied to the source line SL.

At this time, since hot electrons are injected into the memory layers 15 of all the memory cells MC in the NAND cell unit 261c, the reset operation is performed collectively for all the memory cells MC in the NAND cell unit 261c.

In the read operation, a read potential (positive potential) is applied to the selected word line (control gate electrode) WL, and a potential at which the memory cell MC necessarily becomes ON irrespective of the data "0" or "1" is applied to the not-selected word lines (control gate electrodes) WL.

Furthermore, the two select gate transistors ST are switched ON, and a read current is supplied to the NAND string.

Since the selected memory cell MC becomes ON or OFF in accordance with the value of the data stored therein when the read potential is applied, the data can be read out by, for example, detecting the change of the read current.

As shown in FIG. 17B, in another nonvolatile memory device 262 according to the embodiment, a common MIS transistor is used for the select gate transistor ST, without providing the memory layer 15. Thus, the structure of the select gate transistor ST is arbitrary.

As shown in FIG. 17C, in another nonvolatile memory device 263 according to the embodiment, the gate insulating layers of the plurality of memory cells MC constituting the NAND string are replaced with p-type semiconductor layers 47.

Figure 18:
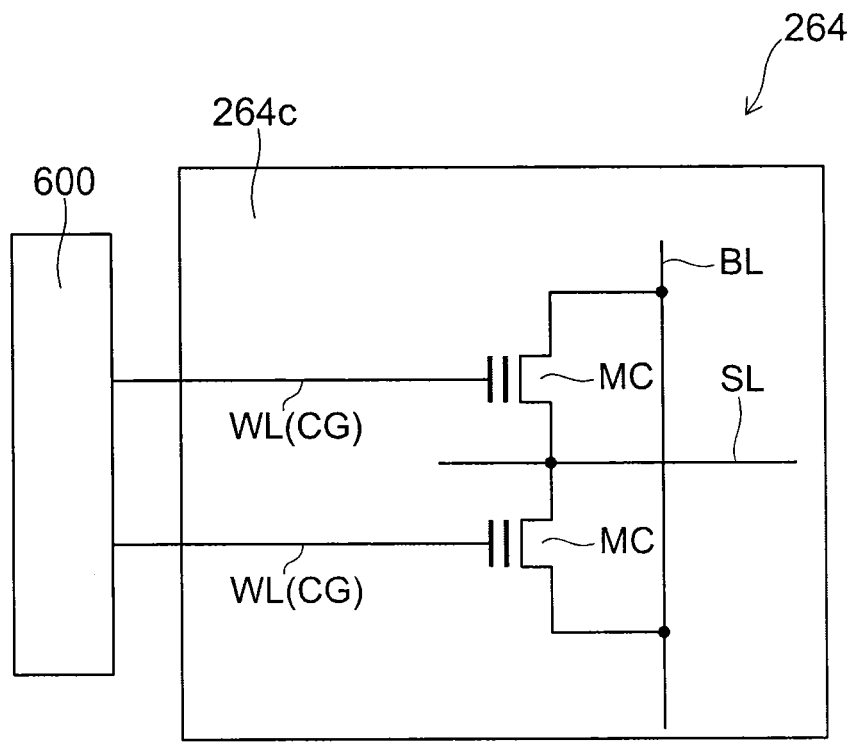
FIG. 18 is a schematic diagram illustrating the configuration of one other nonvolatile memory device according to the fourth embodiment.

FIG. 18 is a schematic diagram illustrating the configuration of another nonvolatile memory device according to the fourth embodiment.

Figure 19:
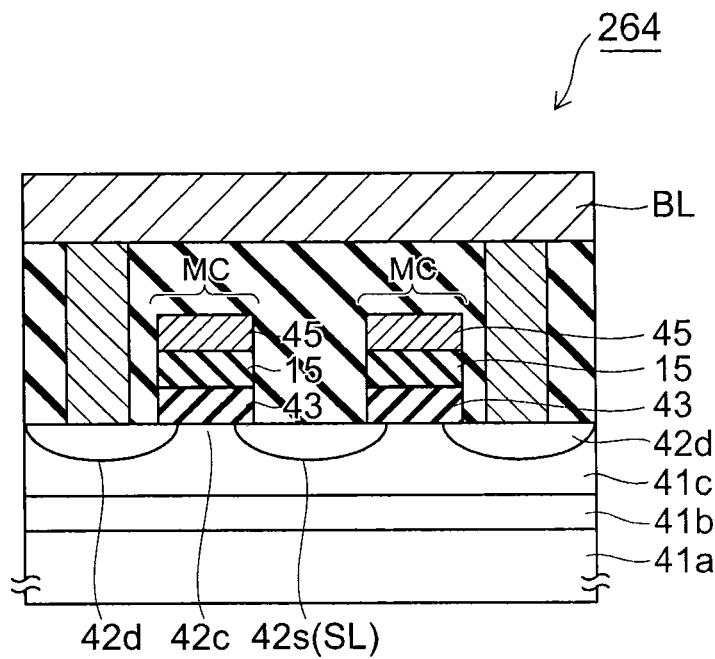
FIG. 19 is a schematic cross-sectional view illustrating the configuration of the one other nonvolatile memory device according to the fourth embodiment.

FIG. 19 is a schematic cross-sectional view illustrating the configuration of the other nonvolatile memory device according to the fourth embodiment.

Another nonvolatile memory device 264 according to the embodiment is a NOR flash memory. FIG. 18 illustrates a circuit diagram of a NOR cell unit 264c. FIG. 19 illustrates the structure of the NOR cell unit 264c.

As shown in FIG. 19, the n-type well region 41b and the p-type well region 41c are formed in the p-type semiconductor substrate 41a. A NOR cell is formed in the p-type well region 41c. The NOR cell includes one memory cell (MIS transistor) MC connected between the bit line BL and the source line SL. The memory cell MC includes the n-type diffusion layers 42, the gate insulating layer 43 on the channel region 42c between the n-type diffusion layers 42, the memory layer 15 on the gate insulating layer 43, and the control gate electrode 45 on the memory layer 15.

As shown in FIG. 18, each control gate electrode 45 (CG) is electrically connected to the drive unit 600. The drive unit 600 may be provided in the substrate in which the NOR cell unit 264c is provided, or may be provided in a substrate different from the substrate. Also in the nonvolatile memory device 264, the operations described in regard to FIG. 15 are performed.

Figure 20:
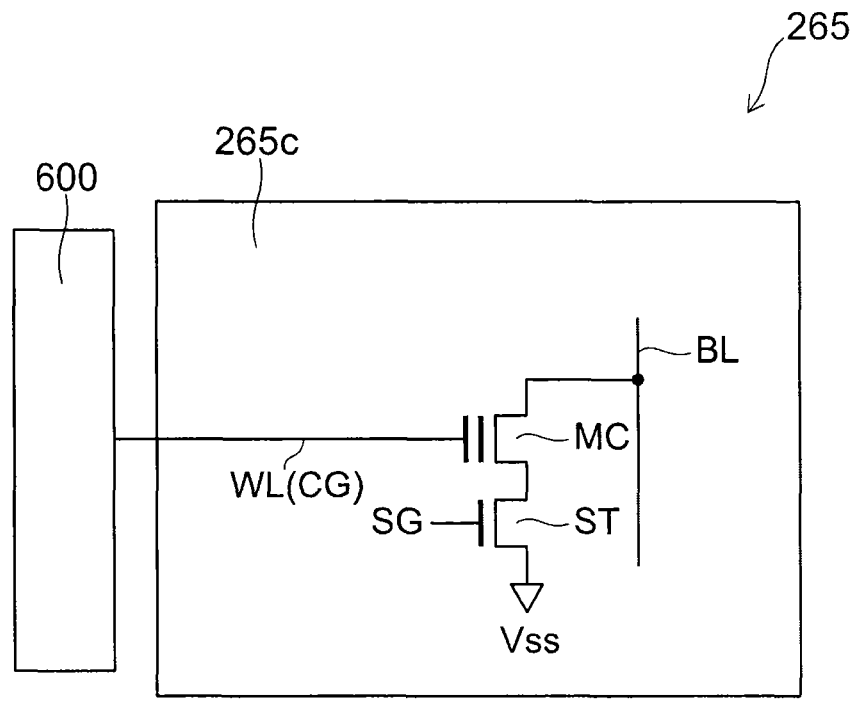
FIG. 20 is a schematic diagram illustrating the configuration of one other nonvolatile memory device according to the fourth embodiment.

FIG. 20 is a schematic diagram illustrating the configuration of one other nonvolatile memory device according to the fourth embodiment.

Figure 21:
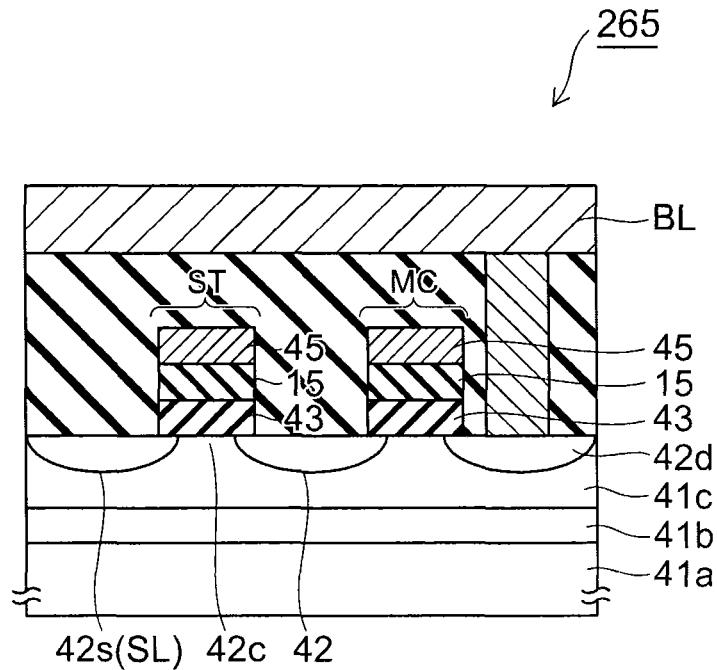
FIG. 21 is a schematic cross-sectional view illustrating the configuration of the one other nonvolatile memory device according to the fourth embodiment.

FIG. 21 is a schematic cross-sectional view illustrating the configuration of the one other nonvolatile memory device according to the fourth embodiment.

One other nonvolatile memory device 265 according to the embodiment is a two-transistor flash memory. FIG. 20 illustrates a circuit diagram of a two-transistor cell unit 265c. FIG. 21 illustrates the structure of the two-transistor cell unit 265c.

As shown in FIG. 20 and FIG. 21, the two-transistor cell unit 265c has a cell structure that has both the feature of the NAND cell unit and the feature of the NOR cell.

The n-type well region 41b and the p-type well region 41c are formed in the p-type semiconductor substrate 41a. The two-transistor cell unit 265c is formed in the p-type well region 41c.

The two-transistor cell unit 265c includes one memory cell MC and one select gate transistor ST connected in series. The memory cell MC has the same structure as the select gate transistor ST. Specifically, these each include the n-type diffusion layers 42, the gate insulating layer 43 on the channel region 42c between the n-type diffusion layers 42, the memory layer 15 on the gate insulating layer 43, and the control gate electrode 45 on the memory layer 15. The select gate transistor ST is connected to the source line SL, and the memory cell MC is connected to the bit line BL. Each control gate electrode 45 (CG) is electrically connected to the drive unit 600. The drive unit 600 may be provided in the substrate in which the two-transistor cell unit 265c is provided, or may be provided in a substrate different from the substrate. Also in the nonvolatile memory device 265, the operations described in regard to FIG. 15 are performed.

Figure 22:
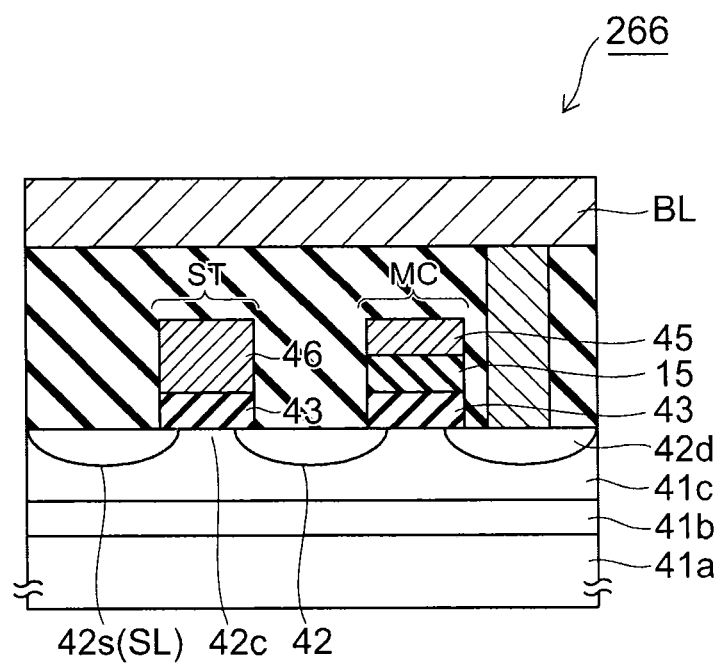
FIG. 22 is a schematic cross-sectional view illustrating the configuration of another nonvolatile memory device according to the fourth embodiment.

FIG. 22 is a schematic cross-sectional view illustrating the configuration of another nonvolatile memory device according to the fourth embodiment.

As shown in FIG. 22, in another nonvolatile memory device 266 according to the embodiment, a common MIS transistor is used for the select gate transistor ST, without providing the memory layer 15. Thus, the structure of the select gate transistor ST is arbitrary.

The nonvolatile memory device according to the embodiment may be used also for the memory medium.

The embodiment provides a nonvolatile memory device that has high process tolerance and maintains high performance.

Hereinabove, embodiments of the invention are described with reference to specific examples. However, the embodiment of the invention is not limited to these specific examples.

For example, one skilled in the art may appropriately select specific configurations of components of nonvolatile memory devices such as first conductive units, second conductive units, memory layers, rectifying elements, substrates, interconnections, and drive units from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices that can be obtained by an appropriate design modification by one skilled in the art based on the nonvolatile memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
    a first conductive unit;
    a second conductive unit; and
    a memory layer provided between the first conductive unit and the second conductive unit, capable of reversibly transitioning between a first state with a low resistance and a second state with a higher resistance than the first state due to a current supplied via the first conductive unit and the second conductive unit, and having a chalcopyrite structure.

2. The device according to claim 1, wherein the memory layer includes at least one selected from the group consisting of cobalt siliconitride, germanium cobalt nitride, cobalt silicophosphide, germanium cobalt phosphide, and cobalt zinc siliconitride.

3. The device according to claim 1, wherein the memory layer includes at least one selected from the group consisting of manganese siliconitride, germanium manganese nitride, manganese silicophosphide, germanium manganese phosphide, and manganese zinc siliconitride.

4. The device according to claim 1, wherein the memory layer includes at least one selected from the group consisting of iron siliconitride, germanium iron nitride, iron silicophosphide, germanium iron phosphide, and iron zinc siliconitride.

5. The device according to claim 1, wherein at least one of the first conductive unit and the second conductive unit includes Si doped with an impurity.

6. The device according to claim 1, wherein at least one of the first conductive unit and the second conductive unit includes a group III-V compound semiconductor doped with an impurity.

7. The device according to claim 1, wherein at least one of the first conductive unit and the second conductive unit has a wurtzite structure, or a zinc blende structure.

8. The device according to claim 1, wherein at least one of the first conductive unit and the second conductive unit includes $Al_{1-u1}Ga_{u1}N_{1-v1}C_{v1}$ ($0 \leq u1 \leq 0.75$, $0 < v1 \leq 0.05$).

9. The device according to claim 1, wherein at least one of the first conductive unit and the second conductive unit includes $Al_{1-u2-v2}Ga_{u2}Ge_{v2}N$ ($0 \leq u2 \leq 0.75$, $0 < v2 \leq 0.05$).

10. The device according to claim 1, wherein a transition between the first state and the second state is based on a movement of an ion in a chalcopyrite structure.

11. The device according to claim 1, wherein the memory layer includes at least one of $CoSiN_2$, $MnSiN_2$, $FeSiN_2$, $Fe_{0.7}SiN_2$, $MnGeN_2$, $FeGeN_2$, $CoGeN_2$, $Fe_{0.7}GeN_2$, $CoSiP_2$, $MnSiP_2$, $FeSiP_2$, $Fe_{0.7}SiP_2$, $MnGeP_2$, $FeGeP_2$, $CoGeP_2$, $Fe_{0.7}GeP_2$, $Co_{0.5}Zn_{0.5}SiN_2$, $Mn_{0.5}Zn_{0.5}SiN_2$, $Fe_{0.5}Zn_{0.5}SiN_2$, $TiSiN_2$, and $Fe_{0.5}Zn_{0.25}SiN_2$.

12. The device according to claim 1, wherein the memory layer includes a material expressed by $A_xM_yX_z$ (A includes at least one selected from the group consisting of Mn, Fe, Co, Ni, Cu, Zn, Mg, Al, Ti, and Ga, M includes at least one selected from the group consisting of Si, Ge, Al, and Ga, X includes at least one selected from the group consisting of N, P, and As, $0.3 \leq x \leq 1$, $0.9 \leq y \leq 1.1$, and $1.9 \leq (z/y) \leq 2.1$).

13. The device according to claim 12, wherein the A includes a transition element.

14. The device according to claim 12, wherein the A is $\alpha_{x1}\beta_{1-x1}$ ($0 \leq x1 \leq 1$) and at least one of the $\alpha$ and the $\beta$ is a transition element.

15. The device according to claim 12, wherein the X is a trivalent element.

16. The device according to claim 12, wherein the X includes at least one of N, P, and As.

17. The device according to claim 12, wherein the X includes a halogen element.

18. The device according to claim 17, wherein a concentration of the halogen element is 1% or less.

19. The device according to claim 1, further comprising:
    a word line; and
    a bit line,
    the first conductive unit, the second conductive unit, and the memory layer being disposed between the word line and the bit line.

20. The device according to claim 19, further comprising a rectifying element provided at least one of between the word line and the memory layer and between the bit line and the memory layer.

* * * * *